(12) United States Patent
Shieh

(10) Patent No.: US 7,148,761 B1
(45) Date of Patent: Dec. 12, 2006

(54) GPS RECEIVER DEVICES AND COMPENSATION METHODS THEREFOR

(75) Inventor: Jia-Horng Shieh, Chunghe (TW)

(73) Assignee: Mediatek Inc., Hsinchu (TW)

( * ) Notice: Subject to any disclaimer, the term of this patent is extended or adjusted under 35 U.S.C. 154(b) by 0 days.

(21) Appl. No.: 11/288,786

(22) Filed: Nov. 29, 2005

(51) Int. Cl.
*H03B 5/32* (2006.01)
*H03L 1/02* (2006.01)

(52) U.S. Cl. ......................................... 331/66; 331/158
(58) Field of Classification Search .................. 331/65, 331/66, 70, 158, 175, 176
See application file for complete search history.

(56) References Cited

U.S. PATENT DOCUMENTS 5,654,718 A    8/1997   Beason et al. .............. 342/357
6,472,943 B1*  10/2002  Soong et al. ................. 331/44
6,509,870 B1   1/2003   Matsushita et al. .... 342/357.15

\* cited by examiner

*Primary Examiner*—David Mis
(74) *Attorney, Agent, or Firm*—Thomas, Kayden, Horstemeyer & Riskey

(57) ABSTRACT

A GPS receiver device comprises a receiver, an oscillator, a memory unit, a temperature sensor, and a processor. The oscillator generates frequency with drift errors occurring at a variety of different temperatures. The memory unit stores coefficients of a plurality of polynomial equations. Each polynomial equation fits a temperature range versus corresponding drift errors. The temperature sensor detects ambient temperature of the receiver. The processor determines which temperature range the ambient temperature belongs to, reads the coefficients of the corresponding polynomial equation from the memory unit according to the determined temperature range, and calculates the drift error of the oscillator at the ambient temperature.

28 Claims, 4 Drawing Sheets

GPS RECEIVER DEVICES AND COMPENSATION METHODS THEREFOR

BACKGROUND

The invention relates to GPS receiver devices, and in particular to methods for compensating frequency drift errors of a crystal oscillator in a GPS receiver device.

Many types of sources for generating accurate frequency are available. The specific type of frequency source implemented within a particular application is determined according to the design constraints of the particular application. Atomic clocks exhibit extreme levels of frequency accuracy, however, their size, cost, and absence of tuning range greatly limit their actual application within an electronic system. Similarly, frequency sources could be realized utilizing the piezoelectric effect of quartz crystals. The small size and relative accuracy of quartz crystal based frequency sources make them popular for most consumer based electronic devices.

The application determines the required type and frequency accuracy of a frequency source. A receiver applied in Global Positioning System (GPS) applications requires a local oscillator (LO) with a high level of frequency accuracy in order to rapidly acquire and maintain synchronization with the signals provided on the GPS carrier frequencies transmitted from satellites. An overview of GPS helps to explain the requirement for frequency accuracy of a local oscillator in a GPS receiver. GPS is a popular technique for position determination. GPS locates position using geometric principles. A constellation of GPS satellites orbits the earth. A GPS receiver can determine its exact position by knowing the positions of the satellites and calculating the distance from the GPS receiver to each of the satellites. The GPS receiver calculates the distance from each satellite to the GPS receiver by determining the time it takes for a satellite signal transmitted by the satellite to reach the GPS receiver. Thus, the GPS receiver must quickly search and acquire the satellite signals utilizing a reference frequency generated by the local oscillator.

Typically, a GPS receiver requires a crystal oscillator to generate reference frequency. However, the frequency drift error of the crystal oscillator can be quite large and is highly dependent on the temperature due to the nature of piezoelectric crystals. FIG. 1 shows an exemplary S-curve representing the frequency drift error versus the temperature. In some GPS receivers, temperature-compensated crystal oscillators are thus used, but they increase the production cost; Some GPS receivers do not use temperature-compensated crystal oscillators and do compensate the frequency drift error by other methods or devices.

In U.S. Pat. No. 5,654,718, a memory is used to store the frequency drift error over a temperature range. The frequency drift error at a specific temperature point can be acquired by looking up a table, however, a large memory is required. In U.S. Pat. No. 6,509,870, a ninth-order polynomial equation is used to fit the S-curve. A large number of operations are required to calculate the coefficients of the ninth-order polynomial equation and the frequency drift error according the ninth-order polynomial equation.

SUMMARY

An exemplary embodiment of a GPS receiver device comprises a receiver, an oscillator, a memory unit, a temperature sensor, and a processor. The receiver locks a signal from a satellite. The oscillator generates a frequency with drift errors at a variety of temperatures. The memory unit stores coefficients of a plurality of polynomial equations. Each polynomial equation fits a temperature range versus the corresponding drift errors. The temperature sensor is coupled to the processor for detecting ambient temperature of the receiver. The processor determines which temperature range the ambient temperature belongs to, reads the coefficients of the corresponding polynomial equation from the memory unit according to the determined temperature range, and calculates the drift error of the oscillator at the ambient temperature using the read coefficients.

In some embodiments, the widths of the temperature ranges can be the same. In some other embodiments, the widths of at least two temperature ranges are different, which may depend on the variation of the corresponding drift errors. The widths of the temperature range is narrower if the variation of the corresponding drift errors is greater, while the widths of the temperature range is wider if the variation of the corresponding drift errors is smaller.

In some embodiments, the polynomial equations can have same order number or different order numbers. In the case of different order numbers, polynomial equations with less order number are usually set for temperature ranges with smaller temperature variation.

An exemplary embodiment of a compensation method for an oscillator of a GPS receiver comprises the following steps. Drift errors of the oscillator at a variety of temperatures are measured, and divided into a plurality of ranges. A plurality of polynomial equations is built, each fits one temperature range versus corresponding drift errors. When ambient temperature of the receiver is detected, a temperature range covers the ambient temperature is determined, and the drift error of the oscillator at the ambient temperature is calculated by the corresponding polynomial equation of the determined temperature range.

DESCRIPTION OF THE DRAWINGS

The invention will become more fully understood from the detailed description given herein below and the accompanying drawings, given by way of illustration only and thus not intended to be limitative of the invention.

DETAILED DESCRIPTION

Figure 1:
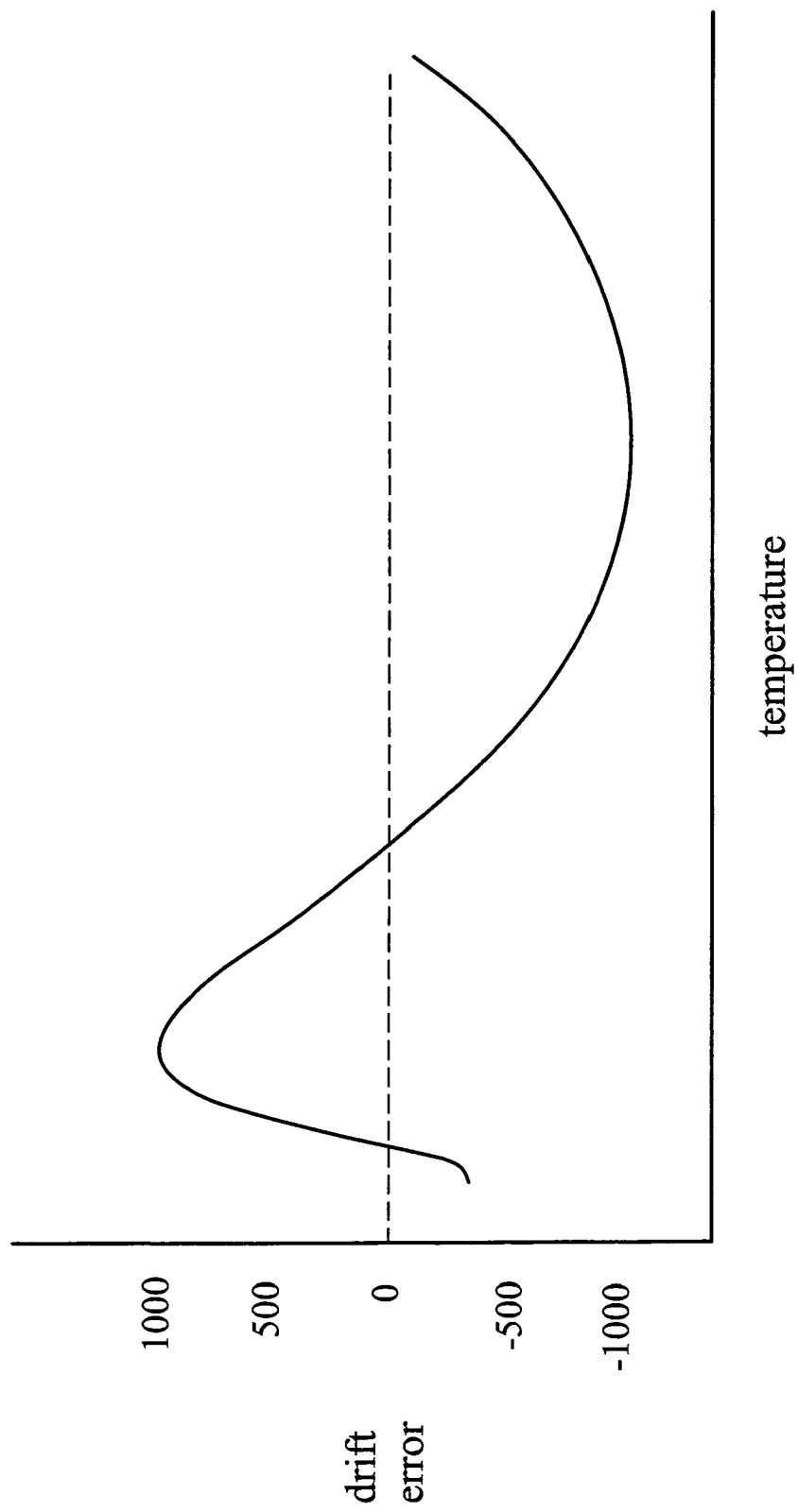
FIG. 1 shows an S-curve of frequency drift errors versus temperatures for a typical crystal used in an oscillator.
Figure 2:
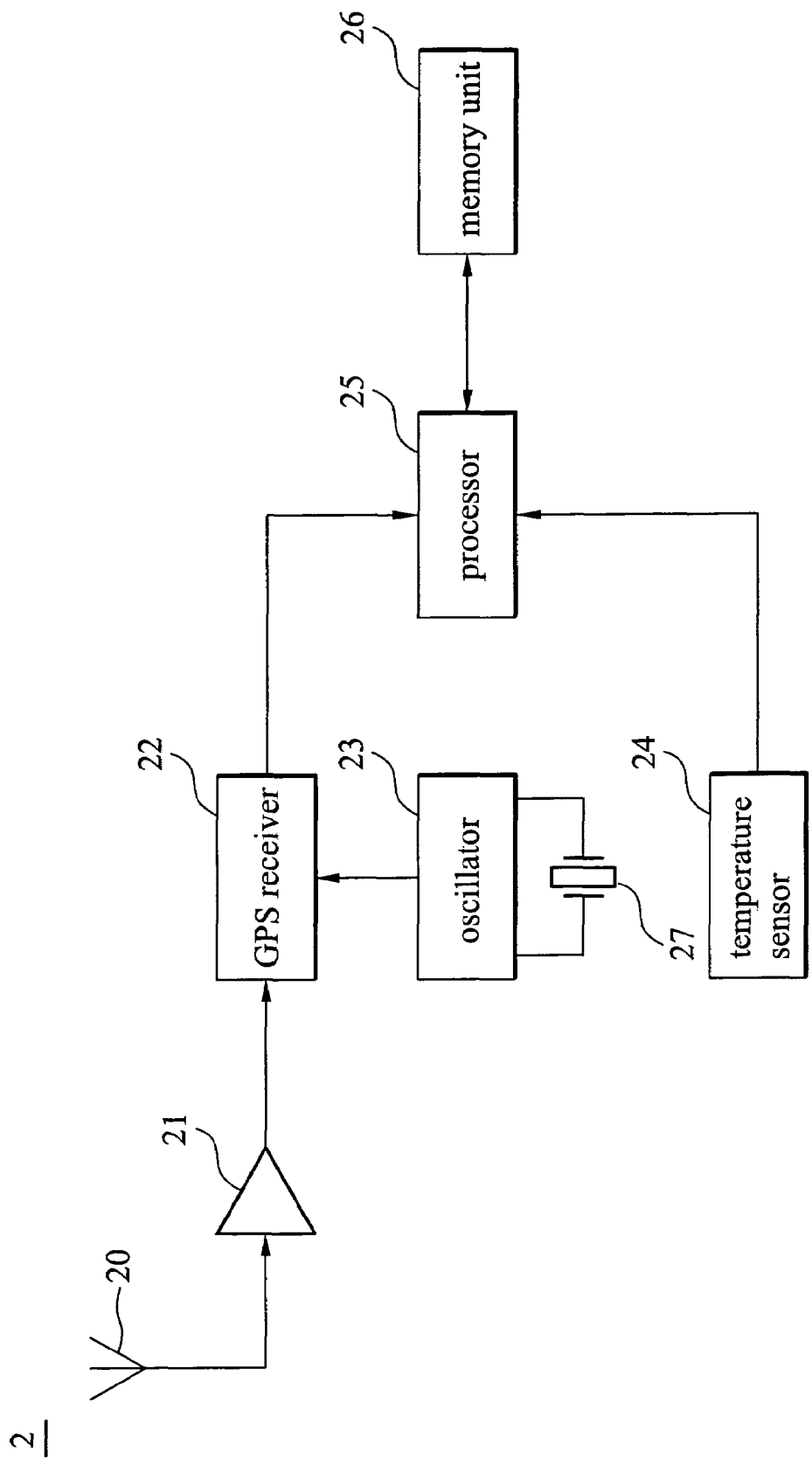
FIG. 2 shows an embodiment of a GPS receiver device.
Figure 3:
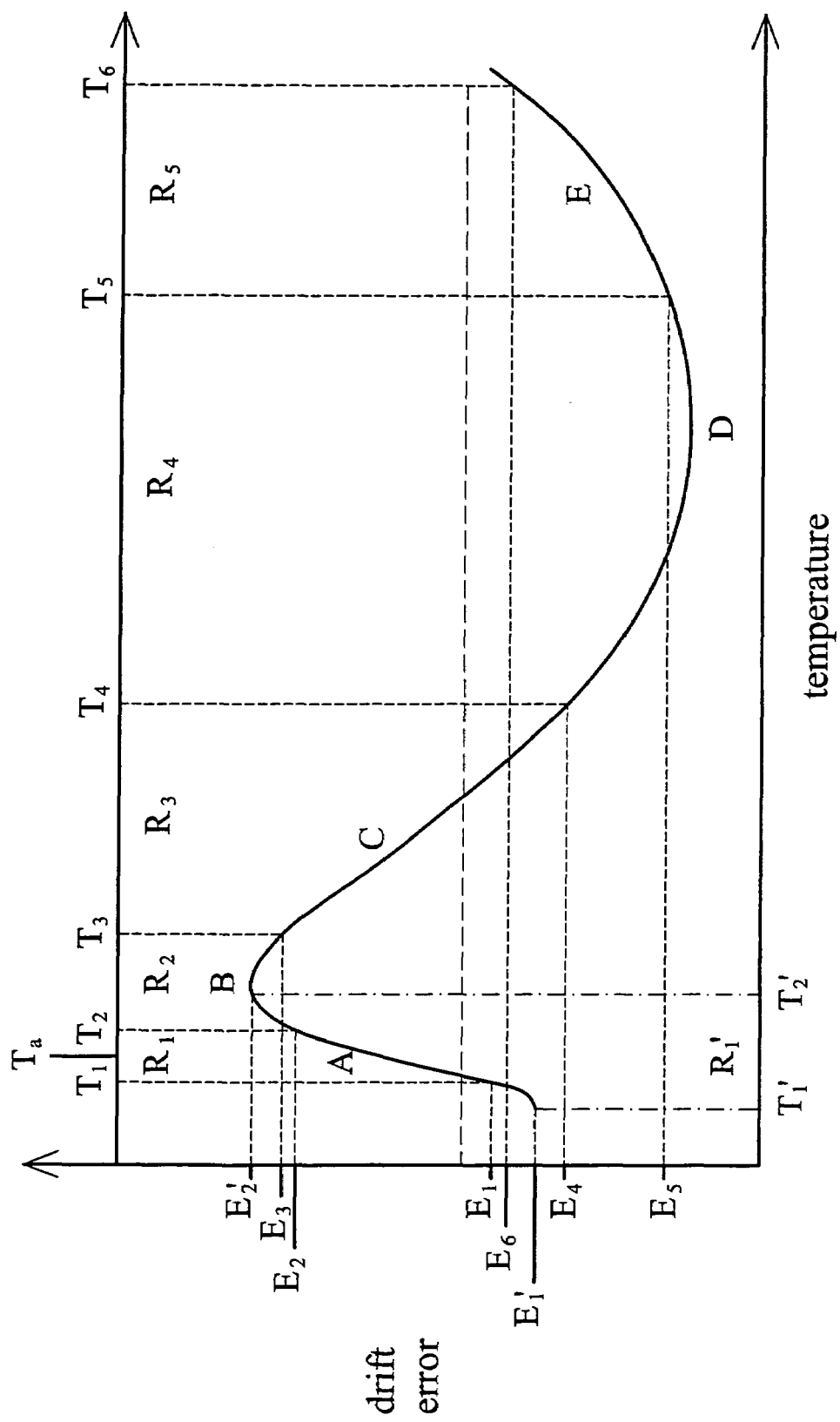
FIG. 3 depicts fitting multiple polynomial equations for the S-curve as shown in FIG. 1.

In an exemplary embodiment of a GPS receiver device in FIG. 2, a GPS receiver device 2 comprises an antenna 20, an amplifier 21, a receiver 22, an oscillator 23, a temperature sensor 24, a processor 25, and a memory unit 26. The memory unit 26 can be a ROM, flash, or non-volatile memory with a back-up battery. The antenna 20 is connected to the receiver 22 through the amplifier 21, and it receives signals from GPS satellites. The oscillator 23 coupled to the receiver 22 has a piezoelectric quartz crystal 27. The oscillator 23 generates a reference frequency by the piezoelectric quartz crystal 27. The receiver 22 locks the signals according to the reference frequency. The reference frequency, however, drifts with temperature due to intrinsic properties thereof, as shown in FIG. 1, thus, the reference frequency generated by the oscillator 23 has a drift error dependent on temperature. Initially, the processor 25 measures drift errors of the reference frequency at a variety of temperatures, and the temperatures are divided into a plurality of ranges. In the embodiment of FIG. 3, the processor 25 divides the temperatures into five ranges R1 to R5, meaning that the S-curve of draft error versus temperature is divided into five sections. For example, the temperature range R1 is from temperature T1 to temperature T2, which corresponds to section A, the temperature range R2 is from T2 to T3, which corresponds to section B, and so on. In this embodiment, the temperature range R1 is set to be narrower because the corresponding drift errors vary rapidly from E1 to E2 in unit time, while the temperature range R4 is set to be wider because the corresponding drift errors vary slowly from E4 to E5 in unit time. In other words, the variation of drift errors per temperature unit in the temperature range R1 is larger, or the absolute gradient of the S-curve is greater. In some embodiments, the widths of the temperature ranges can be the same regardless of the variation of drift errors in the temperature ranges.

The processor 25 builds five polynomial equations, and each polynomial equation fits one temperature range versus the corresponding drift errors. For example, the first polynomial equation fits the temperature range R1 versus the drift errors from E1 to E2, and the second polynomial equation fits the temperature range R2 versus the drift errors from E2 to E3. In the following description, the first polynomial equation related to the temperature range R1 is given as an example, and any other polynomial equation can be obtained in the same way as the first polynomial equation. The first polynomial equation is calculated to fit the temperature range R1 having drift errors from E1 to E2, which is section A of the S-curve. The first polynomial can be a reduced order polynomial such as second or third order polynomial. In some embodiments, a polynomial equation can be calculated by data of drift errors corresponding to an extended temperature range. For example, as shown in FIG. 3, the extended temperature range R1' exceeds the temperature range R1 and overlaps the adjacent temperature range R2. The extended temperature range R1' corresponds to drift errors from E1' to E2'. Parameters of the first polynomial equation calculated for the temperature range R1 are generated according to drift errors from E1' to E2'. In other words, parameters of each polynomial equation can be calculated by data belonging to the adjacent temperature range(s). In some other embodiments, a polynomial equation can be calculated by data of drift errors corresponding to a narrow temperature range. For example, the first polynomial equation is derived from drift errors belonging to a temperature range narrower than the temperature range R1.

In some embodiments, the polynomial equations for fitting the S-curve can have same order number or different order numbers. In the case of employing equations with different order numbers, polynomial equations corresponding to slow/small fluctuation of drift errors may have a lower order number, whereas polynomial equations corresponding to rapid/large fluctuation of drift errors may have a higher order number. For example, the second half of the S-curve shown in FIG. 3 (sections D and E) is relatively smooth, and therefore the sections may be modeled by second or third order polynomial equation. The first half of the S-curve (sections A, B, and C) may be modeled by fourth or fifth order polynomial equation.

In some embodiments, the order number of the polynomial equations can be determined according to desired fitting errors. For example, a polynomial equation desiring to have small fitting errors for the corresponding section of the S-curve may have a higher order number.

After calculating the polynomial equations, the processor 25 sends the coefficients of each polynomial equation to the memory unit 26 for storage. When the polynomial equations have been built and the coefficients thereof have been stored in the memory unit 26, the processor 25 can begin to compensate for drift errors caused by temperature variation. The temperature sensor 24 is coupled to the processor 25 and detects the ambient temperature of the GPS receiver device 2. The temperature sensor 24 sends the detected ambient temperature to the processor 25. The processor 25 determines which temperature range the ambient temperature belongs to, for example, referring to FIG. 3, if the ambient temperature is Ta, the processor 25 determines that the ambient temperature Ta belongs to the temperature range R1. The processor 25 then reads the coefficients of the first polynomial equation related to the temperature range R1 from the memory unit 26. The processor 25 calculates the drift error of the oscillator 23 at the ambient temperature using the first polynomial equation with the read coefficients. Accordingly, the calculated drift error compensates for the frequency drift of the crystal oscillator at the ambient temperature.

Figure 4:
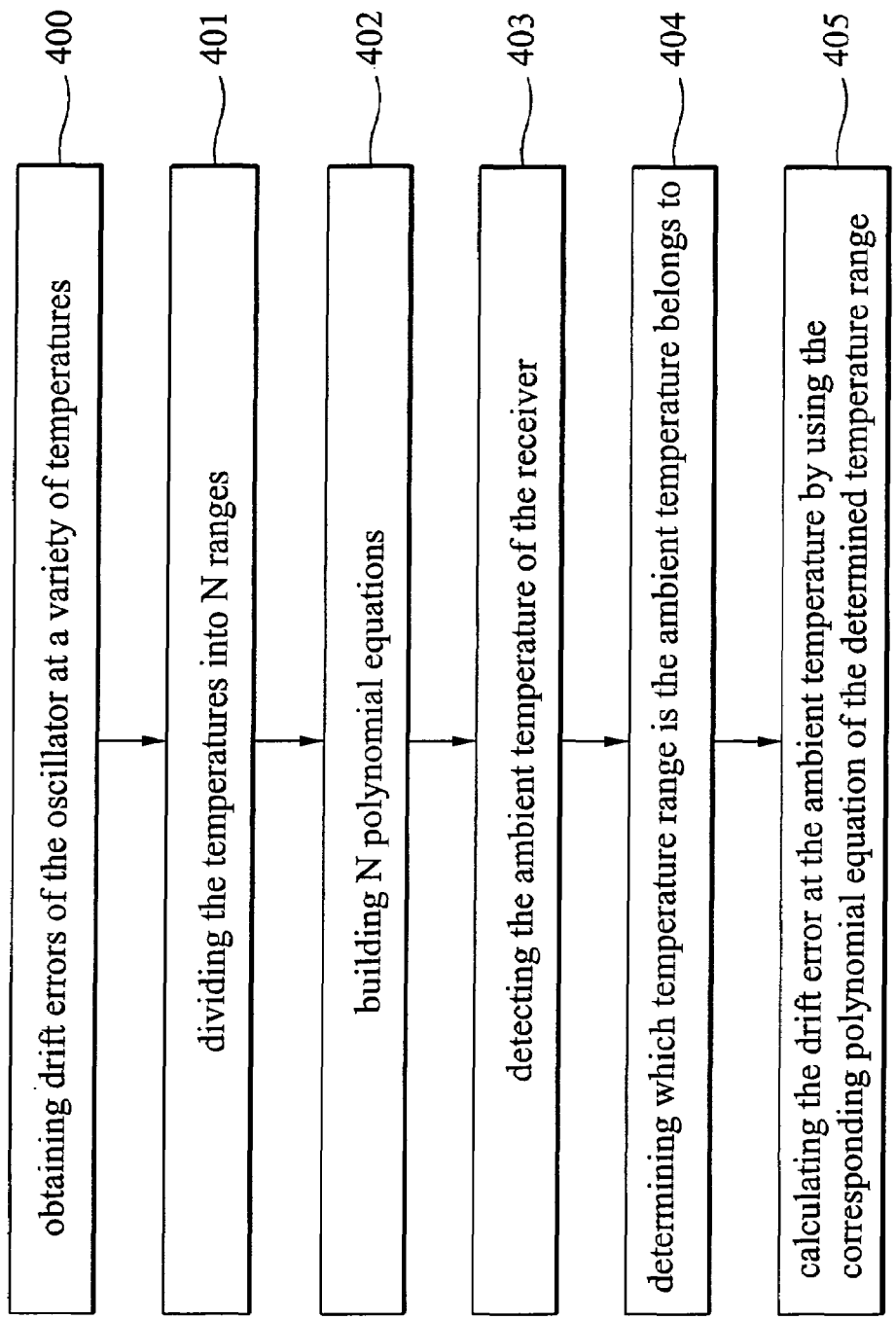
FIG. 4 shows an embodiment of a compensation method for compensating the frequency drift errors of an oscillator.

FIG. 4 shows a flowchart of an embodiment of a compensation method for an oscillator of a GPS receiver. A processor obtains drift errors of the oscillator at a variety of temperatures (step 400) and then divides the temperatures into a plurality of ranges (step 401). In some embodiments, the widths of the temperature ranges can be the same. In some other embodiments, the widths of at least two temperature ranges are different, depending on the variation of the corresponding drift errors or the rate of change in drift errors. The widths of the temperature range can be narrower if the variation or rate of change of the corresponding drift errors is greater, while the widths of the temperature range can be wider if the variation of the corresponding drift errors is smaller. The temperature ranges could be predetermined by using the average S-curve to decide the proper temperature range.

The processor builds N polynomial equations (step 402), and each polynomial equation fits one temperature range versus corresponding drift errors. A temperature sensor detects ambient temperature of the receiver (step 403). The processor determines which temperature range the ambient temperature belongs to (step 404). The processor calculates the drift error of the oscillator at the ambient temperature by using the corresponding polynomial equation of the determined temperature range (step 405). Accordingly, the calculated drift error can compensate for the frequency generated by the oscillator at the particular ambient temperature.

Certain terms are used throughout the following description and claims to refer to particular system components. As one skilled in the art will appreciate, consumer electronic equipment manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

While the invention has been described in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A GPS receiver device comprising:
   a receiver locking onto a signal from a satellite;
   an oscillator generating a frequency with drift errors corresponding to a variety of temperatures;
   a memory unit storing coefficients of a plurality of polynomial equation, wherein each polynomial equation fits a temperature range versus corresponding drift errors;
   a temperature sensor detecting ambient temperature; and
   a processor determining which temperature range the ambient temperature belongs to, reading the coefficients of the corresponding polynomial equation from the memory unit according to the determined temperature range, and calculating a drift error at the ambient temperature using the polynomial equation with the read coefficients;
   wherein the polynomial equations corresponding to different temperature ranges have different order numbers.

2. The GPS receiver device as claimed in claim 1, wherein the widths of the temperature ranges are the same.

3. The GPS receiver device as claimed in claim 1, wherein the widths of at least two temperature ranges are different.

4. The GPS receiver device as claimed in claim 3, wherein the temperature range corresponding to rapid rate of change in drift errors is narrower.

5. The GPS receiver device as claimed in claim 3, wherein the temperature range corresponding to slower rate of change in drift errors is wider.

6. The GPS receiver device as claimed in claim 1, wherein the polynomial equation corresponding to slower rate of change in drift errors is a polynomial equation with a lower order number.

7. The GPS receiver device as claimed in claim 1, wherein the polynomial equation corresponding to rapid rate of change in drift errors is a polynomial equation with a higher order number.

8. The GPS receiver device as claimed in claim 1, wherein the polynomial equation which is desired to have a smaller fitting error for the corresponding temperature range versus the corresponding drift errors may have a higher order number.

9. The GPS receiver device as claimed in claim 1, wherein the coefficients of each polynomial equation for a temperature range are calculated to fit corresponding drift errors with the temperature range.

10. The GPS receiver device as claimed in claim 1, wherein the coefficients of each polynomial equation are calculated by data corresponding to an extended temperature range which exceeds the corresponding temperature range.

11. The GPS receiver device as claimed in claim 10, wherein the extended temperature for each temperature range overlaps at least one adjacent temperature range.

12. The GPS receiver device as claimed in claim 1, wherein the coefficients of each polynomial equation are calculated by data corresponding to a narrow temperature range which is narrower than the corresponding temperature range.

13. The GPS receiver device as claimed in claim 1, wherein the processor measures the drift errors of the oscillator at temperatures, divides the temperatures into the plurality of ranges, and builds the plurality of polynomial equations according to the temperature ranges and the drift errors.

14. The GPS receiver device as claimed in claim 1, wherein the processor compensates for the frequency generated by the oscillator according to the calculated drift error.

15. The GPS receiver device as claimed in claim 1, wherein the memory unit is a ROM, flash, or non-volatile memory with a back-up battery.

16. A compensation method for an oscillator of a GPS receiver, comprising:
    obtaining drift errors of the oscillator at a variety of temperatures;
    dividing the temperatures into a plurality of ranges;
    building a plurality of polynomial equations, each fits one temperature range versus corresponding drift errors;
    detecting ambient temperature;
    determining which temperature range the ambient temperature belongs to; and
    calculating the drift error of the oscillator at the ambient temperature by using the corresponding polynomial equation of the determined temperature range;
    wherein the polynomial equations corresponding to different temperature ranges have different order numbers.

17. The compensation method as claimed in claim 16, wherein the widths of the temperature ranges are the same.

18. The compensation method as claimed in claim 16, wherein the widths of at least two temperature ranges are different.

19. The compensation method as claimed in claim 18, wherein the temperature range corresponding to rapid rate of change in drift errors is narrower.

20. The compensation method as claimed in claim 18, wherein the temperature range corresponding to slower rate of change in drift errors is wider.

21. The compensation method as claimed in claim 16, wherein the polynomial equation corresponding to slower rate of change in drift errors is a lower-order polynomial equation.

22. The compensation method as claimed in claim 16, wherein the polynomial equation corresponding to rapid rate of change in drift errors is a higher-order polynomial equation.

23. The compensation method as claimed in claim 16, wherein the polynomial equation which is desired to have a smaller fitting error for the corresponding temperature range versus the corresponding drift errors may have a higher order number.

24. The compensation method as claimed in claim 16, wherein in the step of building a plurality of polynomial equations, the coefficients of each polynomial equation for a temperature range are calculated to fit corresponding drift errors with the temperature range.

25. The compensation method as claimed in claim 16, wherein in the step of building a plurality of polynomial equations, the coefficients of each polynomial equation are calculated by data corresponding to an extended temperature range which exceeds the corresponding temperature range.

26. The compensation method as claimed in claim 25, wherein the extended temperature for each temperature range overlaps at least one adjacent temperature range.

27. The compensation method as claimed in claim 16, wherein in the step of building a plurality of polynomial equations, the coefficients of each polynomial equation are calculated by data corresponding to a narrow temperature range which is narrower than the corresponding temperature range.

28. The compensation method as claimed in claim 16, further comprising compensating for frequency of the oscillator according to the calculated drift error.

* * * * *